US008681541B2

(12) United States Patent
Lu et al.

(10) Patent No.: US 8,681,541 B2
(45) Date of Patent: Mar. 25, 2014

(54) MAGNETIC MEMORY WITH SEPARATE READ AND WRITE PATHS

(71) Applicant: Seagate Technology LLC, Cupertino, CA (US)

(72) Inventors: Yong Lu, Rosemount, MN (US); Hongyue Liu, Maple Grove, MN (US); Zheng Gao, Savage, MN (US); Insik Jin, Eagan, MN (US); Dimitar V. Dimitrov, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/966,361

(22) Filed: Aug. 14, 2013

(65) Prior Publication Data

US 2014/0015075 A1    Jan. 16, 2014

Related U.S. Application Data

(62) Division of application No. 12/974,699, filed on Dec. 21, 2010, now Pat. No. 8,520,432, which is a division of application No. 12/326,186, filed on Dec. 2, 2008, now Pat. No. 7,881,104.

(60) Provisional application No. 61/087,199, filed on Aug. 8, 2008.

(51) Int. Cl.
*G11C 11/14* (2006.01)

(52) U.S. Cl.
USPC ........................................... 365/171; 365/148

(58) Field of Classification Search
USPC ................................................. 365/148, 171
See application file for complete search history.

(56) References Cited

U.S. PATENT DOCUMENTS

| | | | |
|---|---|---|---|
| 6,906,369 B2 | 6/2005 | Ross |
| 6,906,947 B2 | 6/2005 | Bloomquist |
| 6,940,750 B2 | 9/2005 | Yamamoto |
| 7,009,877 B1 | 3/2006 | Huai |
| 7,098,494 B2 | 8/2006 | Pakala |
| 7,187,577 B1 | 3/2007 | Wang |
| 7,187,578 B2 | 3/2007 | Hong |
| 7,224,601 B2 | 5/2007 | Panchula |
| 7,272,034 B1 | 9/2007 | Chen |
| 7,272,035 B1 | 9/2007 | Chen |
| 7,282,755 B2 | 10/2007 | Pakala |
| 7,286,395 B2 | 10/2007 | Chen |

(Continued)

OTHER PUBLICATIONS

U.S. Appl. No. 12/198,416, filed Aug. 26, 2008, Inventors: Xi et al.

*Primary Examiner* — Hoai V Ho
(74) *Attorney, Agent, or Firm* — Mueting Raasch & Gebhardt PA

(57) ABSTRACT

Magnetic memory having separate read and write paths is disclosed. The magnetic memory unit includes a ferromagnetic strip having a first end portion with a first magnetization orientation, an opposing second end portion with a second magnetization orientation, and a middle portion between the first end portion and the second end portion, the middle portion having a free magnetization orientation. The first magnetization orientation opposes the second magnetization orientation. A tunneling barrier separates a magnetic reference layer from the middle portion forming a magnetic tunnel junction. A bit line is electrically coupled to the second end portion. A source line is electrically coupled to the first end portion and a read line is electrically coupled to the magnetic tunnel junction.

12 Claims, 3 Drawing Sheets

(56) References Cited

U.S. PATENT DOCUMENTS

| | | |
|---|---|---|
| 7,289,356 B2 | 10/2007 | Diao |
| 7,307,876 B2 | 12/2007 | Kent |
| 7,345,912 B2 | 3/2008 | Luo |
| 7,379,327 B2 | 5/2008 | Chen |
| 7,502,249 B1 | 3/2009 | Ding |
| 7,515,457 B2 | 4/2009 | Chen |
| 2006/0007728 A1* | 1/2006 | Sundstrom .................. 365/158 |
| 2006/0215443 A1* | 9/2006 | Katti ............................. 365/158 |
| 2007/0164380 A1 | 7/2007 | Min |
| 2008/0138659 A1 | 6/2008 | Lim |
| 2008/0273380 A1 | 11/2008 | Diao |
| 2008/0310213 A1 | 12/2008 | Chen |
| 2008/0310219 A1 | 12/2008 | Chen |
| 2009/0040855 A1 | 2/2009 | Luo |
| 2009/0185410 A1 | 7/2009 | Huai |
| 2009/0207718 A1 | 8/2009 | Joe |
| 2009/0273421 A1 | 11/2009 | Cros |

\* cited by examiner

US 8,681,541 B2

MAGNETIC MEMORY WITH SEPARATE READ AND WRITE PATHS

CROSS-REFERENCE TO RELATED APPLICATIONS

This application is a divisional of U.S. patent application Ser. No. 12/974,699, filed Dec. 21, 2010, and which is a divisional of U.S. patent application Ser. No. 12/326,186, filed Dec. 2, 2008, now U.S. Pat. No. 7,881,104, which claims the benefit of U.S. Provisional Application No. 60/087,199 filed Aug. 8, 2008, the content of which is hereby incorporated by reference in its entirety.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magnetic Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

A write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before MRAM enters the production stage. One concern in MRAM design is the thickness tradeoff between of the barrier layer of the cell. A thicker barrier layer improves the readability of the MRAM cell but also increases the switching voltage requirement since it is proportional to the thickness of the barrier layer. In addition, high operating voltages limit the flexibility of system integration and increase the size of the select device (e.g., transistor) for the MRAM.

BRIEF SUMMARY

The present disclosure relates to a spin-transfer torque memory unit with separate read and write paths. In particular, the present disclosure relates to a magnetic memory unit that provides a lateral spin torque write and a vertical magnetic tunnel junction read.

In one particular embodiment, a magnetic memory unit includes a ferromagnetic strip having a first end portion with a first magnetization orientation, an opposing second end portion with a second magnetization orientation, and a middle portion between the first end portion and the second end portion, the middle portion having a free magnetization orientation. The first magnetization orientation opposes the second magnetization orientation. A tunneling barrier separates a magnetic reference layer from the middle portion forming a magnetic tunnel junction. A bit line is electrically coupled to the second end portion. A source line is electrically coupled to the first end portion and a read line is electrically coupled to the magnetic tunnel junction.

In another particular embodiment, a spin-transfer torque memory unit includes a ferromagnetic strip having a first portion and an opposing second portion separated from each other. The ferromagnetic strip has a free magnetization orientation. A tunneling barrier separates a first magnetic reference layer from the first portion of the ferromagnetic strip and forming a magnetic tunnel junction. A conductive and non-ferromagnetic layer separates a second magnetic reference layer from the second portion of the ferromagnetic strip and forming a spin valve. A bit line is electrically coupled to the spin valve. A source line is electrically coupled to the ferromagnetic strip and a read line is electrically coupled to the magnetic tunnel junction.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
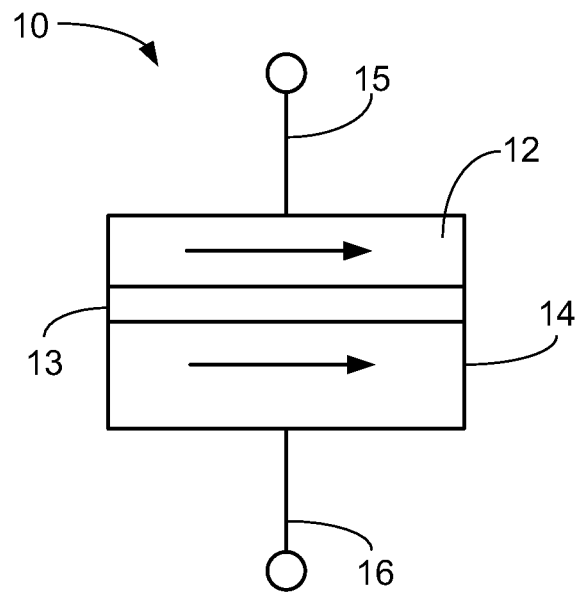
FIG. 1 is a cross-sectional schematic diagram of an illustrative magnetic tunneling junction (MTJ) in the low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a magnetic memory (e.g., spin-transfer torque memory or STRAM) that includes separate read and write paths. The magnetic memory cell includes a low resistance write path based on spin torque transfer and a high resistance read path based on a spin valve. The disclosed magnetic memory cell can provide a lateral spin torque write and a vertical magnetic tunnel junction read. The separation of the read and write paths allows independent tailoring of the electrical and magnetic properties of the magnetic memory cell. Although two transistors can be used in many embodiments of the magnetic memory cell, the read transistor can be a minimum size and the write transistor does not suffer from the large voltage drop of the magnetic tunnel junction since the write current flows thorough the lower resistance spin valve. The write operation has a higher current than the read operation, but does not need a high resistance. A low resistance path that does not include a tunneling insulating barrier is provided for the write operation path. The read operation has a high resistance but a low current, which is satisfied by passing current through the high resistance path that includes the insulating tunneling barrier. Although two transistors are utilized in this design, its overall size can be smaller than that of a traditional magnetic memory design. While the present disclosure is not so limited, an appreciation of various aspects of the disclosure will be gained through a discussion of the examples provided below.

Magnetic memory (MRAM) data is stored by magnetic storage elements such as, for example a magnetic tunneling junction, as described below. Reading the MRAM is accomplished by measuring the electrical resistance of the MRAM cell. A particular cell can be selected by powering an associated transistor which switches current from a supply line through the cell to ground. Due to the magnetic tunnel effect, the electrical resistance of the cell changes due to the orientation of the fields in the magnetic tunneling junction. By measuring the resulting current, the resistance inside any particular cell can be determined, and from this the polarity of the writable magnetic layer of the magnetic tunneling junction, as described below.

Figure 2:
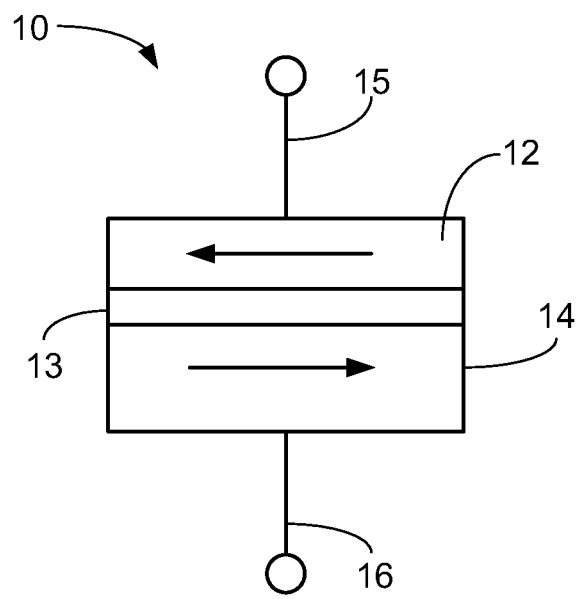
FIG. 2 is a cross-sectional schematic diagram of the illustrative MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any memory cell that can switch between a high resistance state and a low resistance state. In many embodiments, the variable resistive memory cell described herein is a spin-transfer torque memory cell.

The MTJ cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunneling barrier layer. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating tunneling barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free layer 12, the magnetization orientation of the free layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 (and the STRAM cells described below) may be used to construct a memory device that includes multiple variable resistive memory cells where a data bit is stored in magnetic tunnel junction cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
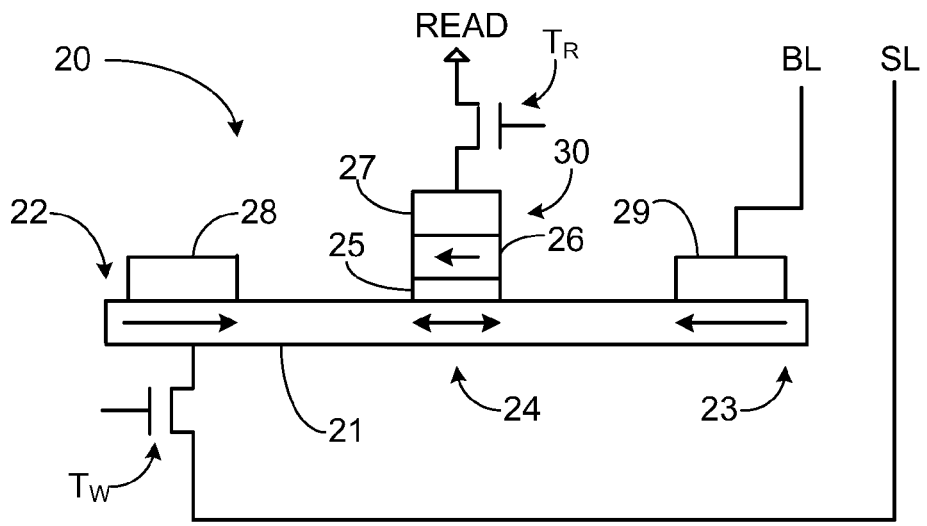
FIG. 3 is a schematic diagram of an illustrative spin-transfer torque memory unit having separate read and write paths.

FIG. 3 is a schematic diagram of an illustrative spin-transfer torque memory unit 20 having a separate read and write path. The spin-transfer torque memory unit 20 includes a ferromagnetic strip 21 having a first end portion 22 with a first magnetization orientation, an opposing second end portion 23 with a second magnetization orientation, and a middle portion 24 between the first end portion 22 and the second end portion 23. The middle portion 24 having a free magnetization orientation. The first magnetization orientation opposes the second magnetization orientation. The ferromagnetic strip 21 can be formed of similar materials to the free layer (12 described above). The ferromagnetic strip 21 can be an elongated element. A source line SL is electrically coupled to the first end portion 22 and a bit line BL is electrically coupled to the second end portion 23.

A tunneling barrier 25 separates a magnetic reference layer 26 from the middle portion 24 and forming a magnetic tunnel junction 30. A read line READ is electrically coupled to the magnetic tunnel junction 30. In many embodiments, a read transistor $T_R$ is electrically coupled to the read line READ and allows a read current to flow through the magnetic tunnel junction 30 and between the read line READ and the bit line BL. The magnetic reference layer 26 can be a single ferromagnetic layer, or may include multiple layers, for example, a pair of ferromagnetically coupled ferromagnetic layers, an anti-ferromagnetic pinning layer and a ferromagnetic pinned layer, a synthetic anti-ferromagnetic, or a synthetic anti-ferromagnetic with an anti-ferromagnetic layer.

In many embodiments, a first magnetic pinning layer 28 is adjacent to the first end portion 22 pinning the first magnetization orientation and a second magnetic pinning layer 29 is adjacent to the second end portion 23 pinning the second magnetization orientation. The first magnetic pinning layer 28 (described herein and throughout this description) can be any useful magnetic pinning element such as, for example, a permanent magnet, a pair of ferromagnetically coupled ferromagnetic layers, an anti-ferromagnetic pinning layer and a ferromagnetic pinned layer, a synthetic anti-ferromagnetic, or a synthetic anti-ferromagnetic with an anti-ferromagnetic layer. In many embodiments, the pinning layer 28 is an anti-ferromagnetic pinning layer. The second magnetic pinning layer 29 (described herein and throughout this description) can be any useful magnetic pinning element such as, for example, a permanent magnet, a pair of ferromagnetically coupled ferromagnetic layers, an anti-ferromagnetic pinning layer and a ferromagnetic pinned layer, a synthetic anti-ferromagnetic, or a synthetic anti-ferromagnetic with an anti-ferromagnetic layer.

The middle portion 24 free magnetization orientation is determined by the direction of the write current between the source line SL and the bit line BL or between the first end portion 22 and the second end portion 23, due to spin torque transfer, as described above. The middle portion 24 free magnetization orientation can rotate between a high resistance state magnetization orientation and a low resistance state magnetization orientation in relation to the magnetic reference layer 26 of the magnetic tunnel junction 30. In many embodiments, a write transistor $T_W$ is electrically coupled to the source line SL or the bit line BL and allows a write current to flow through the ferromagnetic strip 21 and between the first end portion 22 and the second end portion 23.

Figure 4:
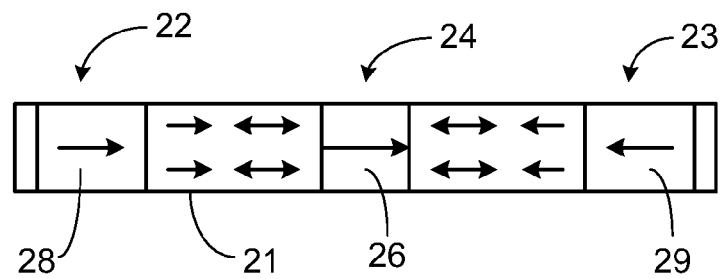
FIG. 4 is a schematic top plan view one illustrative configuration of the spin-transfer torque memory unit shown in FIG. 3.

FIG. 4 is a schematic top plan view one illustrative configuration of the spin-transfer torque memory unit shown in FIG. 3. This configuration is a linear configuration where the ferromagnetic strip 21 has a first end portion 22 with a first magnetization orientation, an opposing second end portion 23 with a second magnetization orientation, and a middle portion 24 between the first end portion 22 and the second end portion 23. The middle portion 24 having a free magnetization orientation. The first magnetization orientation opposes the second magnetization orientation. The electrical connections are not illustrated.

The first magnetic pinning layer 28 is adjacent to the first end portion 22 pinning the first magnetization orientation and a second magnetic pinning layer 29 is adjacent to the second end portion 23 pinning the second magnetization orientation. The magnetic tunnel junction including the magnetic reference element 26 is disposed between the first magnetic pinning layer or element 28 and the second magnetic pinning layer or element 29. Magnetic domains are illustrated as single or double headed arrows along the ferromagnetic strip 21.

Figure 5:
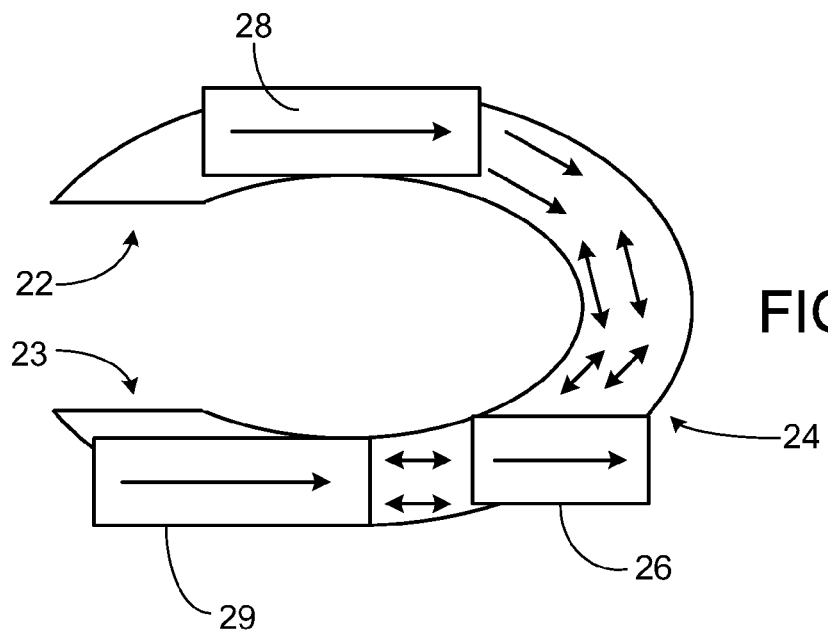
FIG. 5 is a schematic top plan view of another illustrative configuration of the spin-transfer torque memory unit shown in FIG. 3.

FIG. 5 is a schematic top plan view of another illustrative configuration of the spin-transfer torque memory unit shown in FIG. 3. This configuration is a curved or semi-circular configuration where the ferromagnetic strip 21 has a first end portion 22 with a first magnetization orientation, an opposing second end portion 23 with a second magnetization orientation, and a middle portion 24 between the first end portion 22 and the second end portion 23. The middle portion 24 having a free magnetization orientation. The first magnetization orientation opposes the second magnetization orientation. The electrical connections are not illustrated. The first end portion 22 and the second end portion 23 are adjacent to each other but are not touching.

The first magnetic pinning layer 28 is adjacent to the first end portion 22 pinning the first magnetization orientation and a second magnetic pinning layer 29 is adjacent to the second end portion 23 pinning the second magnetization orientation. The magnetic tunnel junction including the magnetic reference element 26 is disposed between the first magnetic pinning layer or element 28 and the second magnetic pinning layer or element 29. Magnetic domains are illustrated as single or double headed arrows along the ferromagnetic strip 21. This configuration allows for ease of processing as the anti-ferromagnetic elements 28 and 29 and the magnetic reference element 26 can be deposited with the magnetic orientations directed in the same direction, as illustrated.

Figure 6:
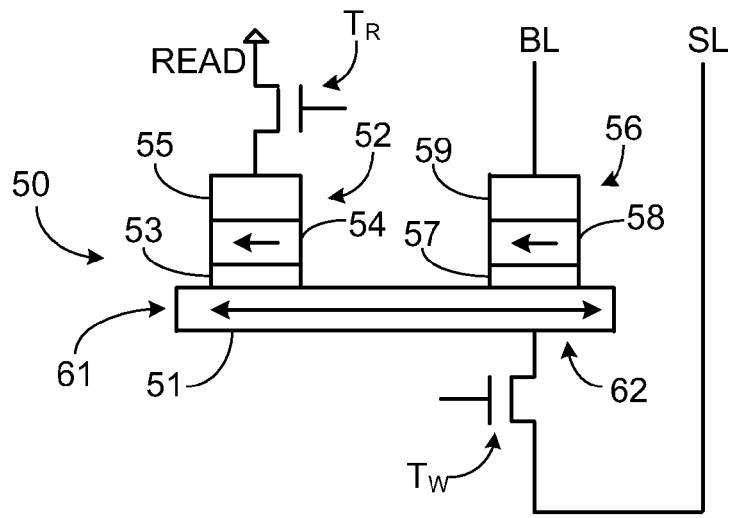
FIG. 6 is a schematic diagram of another illustrative spin-transfer torque memory unit having separate read and write paths.

FIG. 6 is a schematic diagram of another illustrative spin-transfer torque memory unit 50 having separate read and write paths. The spin-transfer torque memory unit 50 includes a ferromagnetic strip 51 having a first portion 61 and an opposing second portion 62 separated from each other, the ferromagnetic strip 51 has a free magnetization orientation. A tunneling barrier 53 separates a first magnetic reference layer 54 from the first portion 61 of the ferromagnetic strip 51 and forming a magnetic tunnel junction 52. A conductive and non-ferromagnetic layer or spacer layer 57 separates a second magnetic reference layer 58 from the second portion 62 of the ferromagnetic strip 51 and forming a spin valve 56. The conductive and non-ferromagnetic layer or spacer layer 57 can be formed of any useful conductive and non-ferromagnetic material such as, for example, Cu, Ru, Au, Ag, and the like.

A bit line BL is electrically coupled to the spin valve 56. A source line SL is electrically coupled to the ferromagnetic strip 51. A read line READ is electrically coupled to the magnetic tunnel junction 56. In many embodiments, the magnetic tunnel junction 52 is separated from spin valve 56 except for the common ferromagnetic strip 51 forming a free magnetic layer.

In many embodiments, a read transistor $T_R$ is electrically coupled to the read line READ and allows a read current to flow through the magnetic tunnel junction 52 and between the read line READ and the bit line BL. During the read operation, a read current is applied through the magnetic tunnel junction 52 that has a higher resistance than the spin valve 56.

In many embodiments, a write transistor $T_W$ is electrically coupled to the source line SL or the bit line BL and allows a write current to flow through the spin valve 56. During the write operation, a write current is applied through the spin valve 56 that has a lower resistance than the magnetic tunnel junction 52. The ferromagnetic strip 51 free magnetization orientation is determined by the direction of the write current between the source line SL and the bit line BL, due to spin torque transfer, as described above. The ferromagnetic strip 51 free magnetization orientation can rotate between a high resistance state magnetization orientation (anti-parallel) and a low resistance state magnetization orientation (parallel) in relation to the first magnetic reference layer 54 of the magnetic tunnel junction 52 when a read current passes through the magnetic tunnel junction 52.

The first magnetic reference layer 54 and the second magnetic reference layer 58 can independently be a single ferromagnetic layer, or may include multiple layers, for example, a pair of ferromagnetically coupled ferromagnetic layers, an anti-ferromagnetic pinning layer and a ferromagnetic pinned layer, a synthetic anti-ferromagnetic, or a synthetic anti-ferromagnetic with an anti-ferromagnetic layer. The illustrated embodiment of the magnetic tunnel junction 52 includes an anti-ferromagnetic pinning layer 55 and a ferromagnetic pinned layer 54. The illustrated embodiment of the spin valve 56 includes an anti-ferromagnetic pinning layer 59 and a ferromagnetic pinned layer 58.

Figure 7:
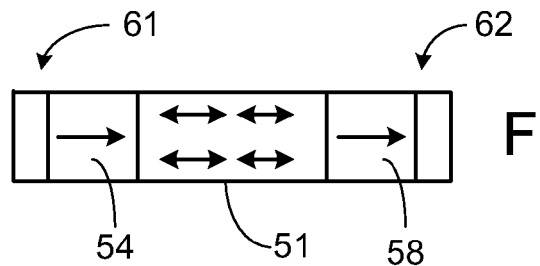
FIG. 7 is a schematic top plan view one illustrative configuration of the spin-transfer torque memory unit shown in FIG. 6.

FIG. 7 is a schematic top plan view one illustrative configuration of the spin-transfer torque memory unit shown in FIG. 6. This configuration is a linear configuration where the ferromagnetic strip 51 has a first portion 61 and an opposing second portion 62 separated from each other. The ferromagnetic strip 51 has a free magnetization orientation. A tunneling barrier separates a first magnetic reference layer 54 from the first portion 61 of the ferromagnetic strip 51 and forms a magnetic tunnel junction. A conductive and non-ferromagnetic layer or spacer layer separates a second magnetic reference layer 58 from the second portion 62 of the ferromagnetic strip 51 and forming a spin valve. Magnetic domains are illustrated as double headed arrows along the ferromagnetic strip 51.

Figure 8:
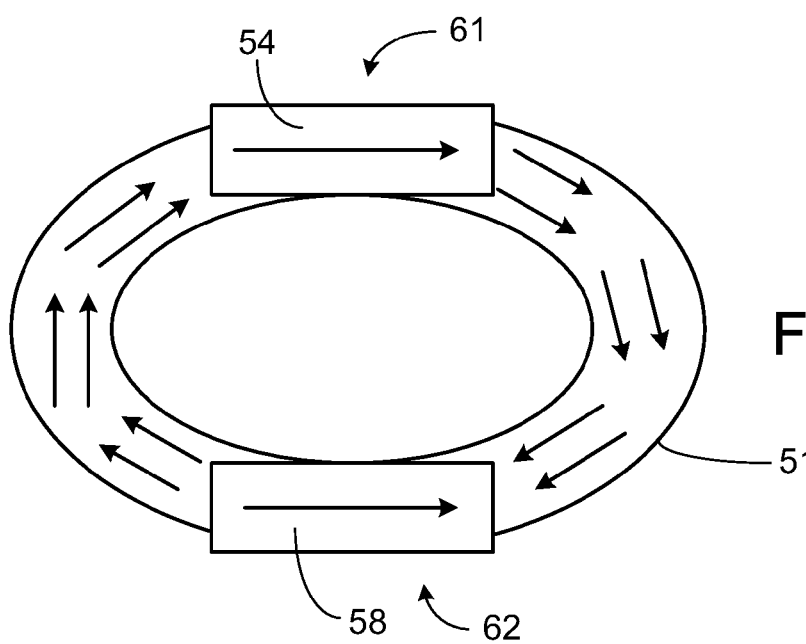
FIG. 8 is a schematic top plan view of another illustrative configuration of the spin-transfer torque memory unit shown in FIG. 6.

FIG. 8 is a schematic top plan view of another illustrative configuration of the spin-transfer torque memory unit shown in FIG. 6. This configuration is a ring or circular configuration where the ferromagnetic strip 51 has a first portion 61 and an opposing second portion 62. The ferromagnetic strip 51 has a free magnetization orientation. The electrical connections are not illustrated.

A tunneling barrier separates a first magnetic reference layer 54 from the first portion 61 of the ferromagnetic strip 51 and forms a magnetic tunnel junction. A conductive and non-ferromagnetic layer or spacer layer separates a second magnetic reference layer 58 from the second portion 62 of the ferromagnetic strip 51 and forming a spin valve. Magnetic domains are illustrated as single headed arrows along the ferromagnetic strip 51. This configuration allows for ease of processing as the reference magnetic elements 54 and 58 can be deposited with the magnetic orientations directed in the same direction, as illustrated.

Thus, embodiments of the MAGNETIC MEMORY WITH SEPARATE READ AND WRITE PATHS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic memory unit, comprising:
a ferromagnetic strip forming a curved structure and having a first portion with a first magnetization orientation, a second portion with a second magnetization orientation, and a middle portion between the first portion and the second portion, the middle portion having a free magnetization orientation, the first magnetization orientation opposes the second magnetization orientation;
a tunneling barrier separates a magnetic reference layer from the middle portion and forming a magnetic tunnel junction;
a bit line is electrically coupled to the second end portion;
a source line is electrically coupled to the first end portion; and
a read line is electrically coupled to the magnetic tunnel junction.

2. A magnetic memory unit according to claim 1, wherein the free magnetization orientation of the middle portion rotates due to spin torque transfer based on a direction of a write current between the first portion or the second portion.

3. A magnetic memory unit according to claim 2, wherein the free magnetization orientation of the middle portion rotates between a high resistance state magnetization orientation and a low resistance state magnetization orientation.

4. A magnetic memory unit according to claim 1, further comprising a first pinning layer adjacent to the first portion pinning the first magnetization orientation and a second pinning layer adjacent to the second portion pinning the second magnetization orientation.

5. A magnetic memory unit according to claim 1, further comprising a write transistor electrically coupled to the source line and a read transistor electrically coupled to the read line.

6. A magnetic memory unit according to claim 4, wherein the first pinning layer comprises a first anti-ferromagnetic layer and the second pinning layer comprises a second anti-ferromagnetic layer.

7. A magnetic memory unit according to claim 1, wherein the ferromagnetic strip forms a ring structure.

8. A magnetic memory unit, comprising:
a ferromagnetic strip forming a curved structure and having a first end portion with a first magnetization orientation, an opposing second end portion with a second magnetization orientation, and a middle portion between the first end portion and the second end portion, the middle portion having a free magnetization orientation, the first magnetization orientation opposes the second magnetization orientation and the first end portion being separated from the second end portion;

a tunneling barrier separates a magnetic reference layer from the middle portion and forming a magnetic tunnel junction;

a bit line is electrically coupled to the second end portion;

a source line is electrically coupled to the first end portion; and a read line is electrically coupled to the magnetic tunnel junction.

9. A magnetic memory unit according to claim 8, further comprising a first magnetic pinning layer adjacent to the first end portion pinning the first magnetization orientation and a second magnetic pinning layer adjacent to the second end portion pinning the second magnetization orientation wherein the first magnetization orientation and the second magnetization orientation are aligned in the same direction.

10. A magnetic memory unit according to claim 9, wherein the first magnetization orientation, the second magnetization orientation, and a magnetization orientation of the magnetic reference layer are aligned in the same direction.

11. A magnetic memory unit according to claim 8, wherein the free magnetization orientation of the middle portion rotates due to spin torque transfer based on a direction of a write current between the first end portion or the second end portion.

12. A magnetic memory unit according to claim 8, wherein the free magnetization orientation of the middle portion rotates between a high resistance state magnetization orientation and a low resistance state magnetization orientation.

* * * * *